United States Patent
Too et al.

(10) Patent No.: US 7,544,542 B2
(45) Date of Patent: Jun. 9, 2009

(54) REDUCTION OF DAMAGE TO THERMAL INTERFACE MATERIAL DUE TO ASYMMETRICAL LOAD

(75) Inventors: Seah Sun Too, San Jose, CA (US); Raj N. Master, San Jose, CA (US); Jacquana Diep, San Jose, CA (US); Mohammad Khan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 3 days.

(21) Appl. No.: 11/462,993

(22) Filed: Aug. 7, 2006

(65) Prior Publication Data

US 2008/0124841 A1    May 29, 2008

(51) Int. Cl.
*H01L 21/44* (2006.01)
(52) U.S. Cl. .............................. 438/125; 257/E23.087; 257/E23.09; 257/E23.092; 257/E25.013
(58) Field of Classification Search .................. 438/125
See application file for complete search history.

(56) References Cited

U.S. PATENT DOCUMENTS

| | | | |
|---|---|---|---|
| 5,329,160 A | 7/1994 | Miura et al. | |
| 5,552,635 A * | 9/1996 | Kim et al. | 257/706 |
| 5,844,309 A | 12/1998 | Takigawa et al. | |
| 6,114,413 A * | 9/2000 | Kang et al. | 523/210 |
| 6,409,859 B1 * | 6/2002 | Chung | 156/69 |
| 6,496,373 B1 * | 12/2002 | Chung | 361/705 |
| 6,581,276 B2 * | 6/2003 | Chung | 29/825 |
| 6,617,698 B2 * | 9/2003 | Buchwalter et al. | 257/783 |
| 6,652,665 B1 * | 11/2003 | Sachdev et al. | 134/26 |
| 6,748,350 B2 | 6/2004 | Rumer et al. | |
| 6,848,172 B2 | 2/2005 | Fitzgerald et al. | |
| 6,848,610 B2 | 2/2005 | Liu | |
| 6,867,978 B2 | 3/2005 | Whittenburg et al. | |
| 6,870,258 B1 | 3/2005 | Too | |
| 6,882,535 B2 | 4/2005 | Labanok et al. | |
| 6,924,170 B2 | 8/2005 | Ravi et al. | |
| 6,934,154 B2 | 8/2005 | Prasher et al. | |
| 6,936,501 B1 | 8/2005 | Too et al. | |
| 6,987,317 B2 | 1/2006 | Pike | |
| 6,989,586 B2 | 1/2006 | Agraharam et al. | |
| 7,009,289 B2 | 3/2006 | Hu et al. | |

(Continued)

FOREIGN PATENT DOCUMENTS

GB    2345577 A    7/2000

(Continued)

OTHER PUBLICATIONS

International Search Report for PCT/US2007/017523; Dec. 13, 2007.

*Primary Examiner*—Fernando L Toledo
(74) *Attorney, Agent, or Firm*—Timothy M. Honeycutt

(57) ABSTRACT

Various method and apparatus for packaging an integrated circuit are provided. In one aspect, a method of packaging an integrated circuit is provided that includes coupling an integrated circuit to a substrate, mixing an adhesive with a plurality of particles, and coupling a lid to the substrate with the adhesive. At least a portion of the plurality of particles in the adhesive oppose compressive force from the lid to restrict rotation of the lid relative to the substrate.

18 Claims, 5 Drawing Sheets

U.S. PATENT DOCUMENTS

| | | |
|---|---|---|
| 7,012,011 B2 | 3/2006 | Chrysler et al. |
| 7,014,093 B2 | 3/2006 | Houle et al. |
| 7,015,073 B2 | 3/2006 | Houle et al. |
| 7,078,803 B2 * | 7/2006 | Tilton et al. ................. 257/714 |
| 2001/0029119 A1 * | 10/2001 | Chung .......................... 439/91 |
| 2002/0000239 A1 * | 1/2002 | Sachdev et al. ................ 134/2 |
| 2002/0179921 A1 | 12/2002 | Cohn |
| 2004/0061218 A1 * | 4/2004 | Tilton et al. ................. 257/710 |
| 2004/0077126 A1 | 4/2004 | Geefay |
| 2007/0108634 A1 | 5/2007 | Higashi et al. |
| 2007/0251639 A1 * | 11/2007 | Jayaraman et al. .......... 156/283 |
| 2007/0270536 A1 * | 11/2007 | Sachdev et al. ............. 524/440 |

FOREIGN PATENT DOCUMENTS

WO    WO 2005055317    6/2005

* cited by examiner

US 7,544,542 B2

REDUCTION OF DAMAGE TO THERMAL INTERFACE MATERIAL DUE TO ASYMMETRICAL LOAD

BACKGROUND OF THE INVENTION

1. Field of the Invention

This invention relates generally to semiconductor processing, and more particularly to apparatus and methods of packaging semiconductor chips.

2. Description of the Related Art

Heat is an enemy of most electronic devices. Integrated circuits, such as various types of processors, can be particularly susceptible to heat-related performance problems or device failure. Over the years, the problem of cooling integrated circuits has been tackled in a variety of ways. For conventional plastic or ceramic packaged integrated circuits, cooling fans, heat fins and even liquid cooling systems have been used, often with great success.

In the past few years, the size and power consumption of integrated circuits has climbed to the point where designers have turned to other ways to shed heat. One of these techniques involves using a metal lid for an integrated circuit package. The goal is to use the high thermal conductivity of the metal lid to ferry heat away from an integrated circuit. Of course, to ensure a conductive heat transfer pathway from the integrated circuit, designers early on placed a thermal paste between the integrated circuit and the lid.

One type of conventionally-used thermal interface material consists of a polymer, such as silicone rubber, mixed with thermally conductive metal particles, such as copper or aluminum. The polymer provides a compliant film between the integrated circuit and the overlying lid and easily provides a matrix to hold the thermally conductive metal particles. The thermal resistance of the thermal interface material is dependent on, among various things, the spacing between the metallic particles.

As noted above, heat sinks or fins are now routinely used to convey heat from chip packages. Heat sinks are usually connected to the package lid by some form of clamping mechanism or by way of one or more screws. A difficulty associated with the installation of heat sinks is the frequent lack of precision on the part of the installer. If the installation is done improperly, the heat sink may impose an asymmetric top-down loading on the lid. The asymmetric loading may cause the lid to rotate. If the rotation is severe enough, one side or the other of the thermal interface material may be stretched. The stretching, if severe enough may cause fracture or debonding of the thermal interface material. Even without mechanical failure, the stretching will increase the distances between the metallic particles in the polymer and thereby increase the thermal resistance thereof. Higher thermal resistance can lead to hot spots.

The present invention is directed to overcoming or reducing the effects of one or more of the foregoing disadvantages.

SUMMARY OF THE INVENTION

In accordance with one aspect of the present invention, a method of packaging an integrated circuit is provided that includes coupling an integrated circuit to a substrate, mixing an adhesive with a plurality of particles, and coupling a lid to the substrate with the adhesive. At least a portion of the plurality of particles in the adhesive oppose compressive force from the lid to restrict rotation of the lid relative to the substrate.

In accordance with another aspect of the present invention, an integrated circuit package is provided that includes a substrate that has a first surface and an integrated circuit coupled to the first surface of the substrate. An adhesive is positioned on the first surface of the substrate. The adhesive has a plurality of particles. A lid is coupled to the first surface of the substrate with the adhesive. At least a portion of the plurality of particles in the adhesive oppose compressive force from the lid to restrict rotation of the lid relative to the substrate.

In accordance with another aspect of the present invention, a method of packaging an integrated circuit is provided that includes coupling an integrated circuit to a substrate, providing a lid that has a lip, and positioning a member between the lip of the lid and the substrate. The lid is coupled to the substrate with an adhesive. The member elevates the lip of the lid relative to the substrate to restrict rotation of the lid relative to the substrate.

In accordance with another aspect of the present invention, an integrated circuit package is provided that includes a substrate that has a first surface. An integrated circuit is coupled to the first surface of the substrate. An adhesive is positioned on the first surface of the substrate. A lid is coupled to the first surface of the substrate with the adhesive. The lid has a lip positioned proximate the first surface of the substrate and a member positioned between the lip of the lid and the substrate. The member elevates the lip of the lid relative to the substrate to restrict rotation of the lid relative to the substrate.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
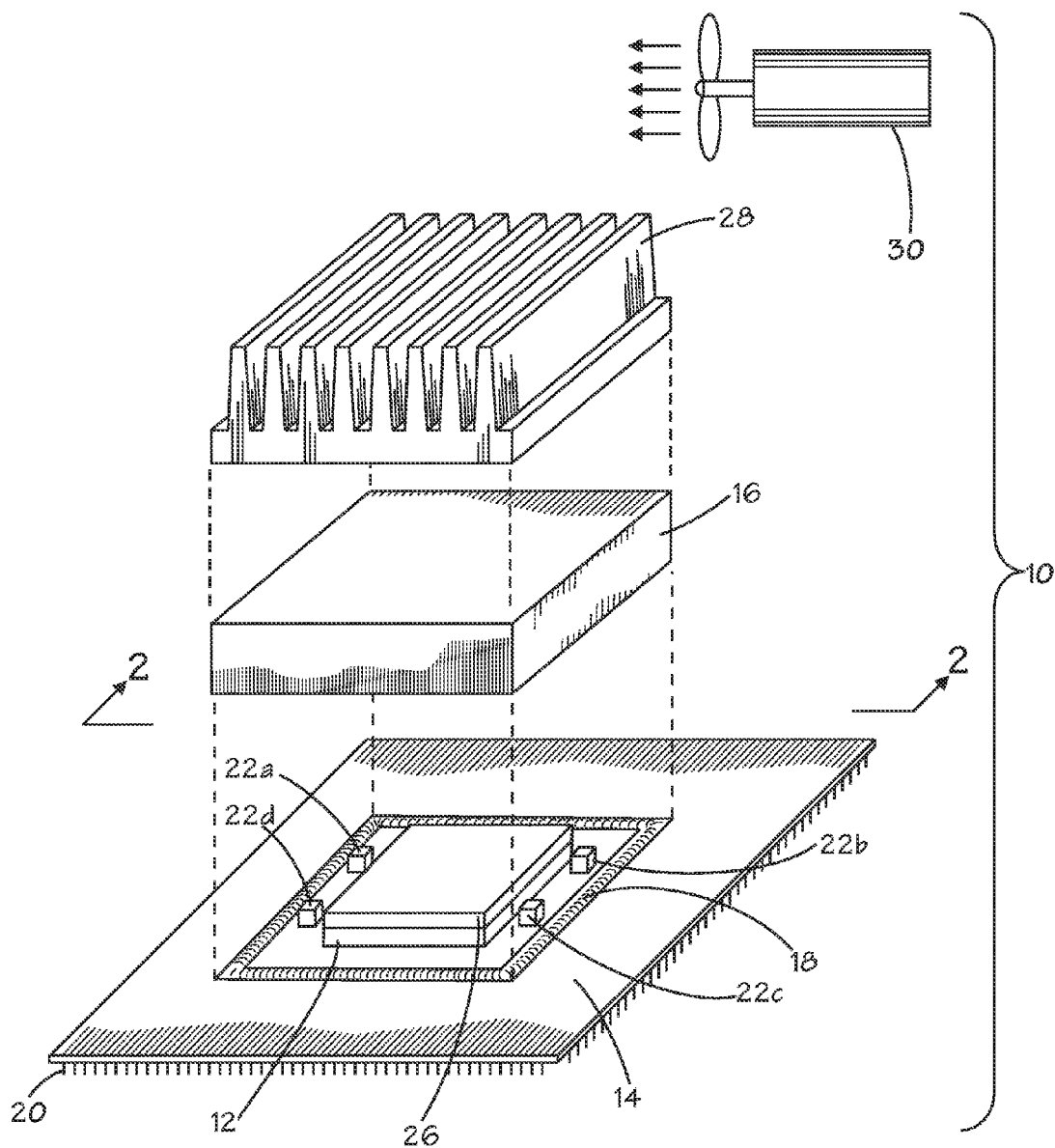
FIG. 1 is a partially-exploded pictorial view of an exemplary conventional semiconductor chip package system.

In the drawings described below, reference numerals are generally repeated where identical elements appear in more than one figure. Turning now to the drawings, and in particular to FIG. 1, therein is shown a partially-exploded pictorial view of an exemplary conventional semiconductor chip package system 10 that is designed to enclose and cool a semiconductor die 12. The system 10 includes a substrate 14 upon which the die 12 is mounted in a flip-chip fashion and a metallic lid 16 that is seated on the substrate 14 and encloses the semiconductor die 12. The lid 16 is held in place by way of a bead of adhesive 18. Electrical interconnects between the semiconductor die 12 and systems external to the substrate 14 are provided by way of a plurality of pins 20 which project downwardly from the substrate 14 as shown. One or more filter capacitors 22a, 22b, 22c and 22d are provided on the substrate 14 to provide electrical protection for the semiconductor die 12.

The semiconductor die 12 is provided with a polymeric thermal interface material 26. The polymeric thermal interface material 26 is designed to provide an advantageous conductive heat transfer pathway from the semiconductor die 12 to the overlying metallic lid 16 and a heat sink 28 positioned on the lid 16. A cooling fan 30 is typically used in conjunction with the heat sink 28.

Figure 2:
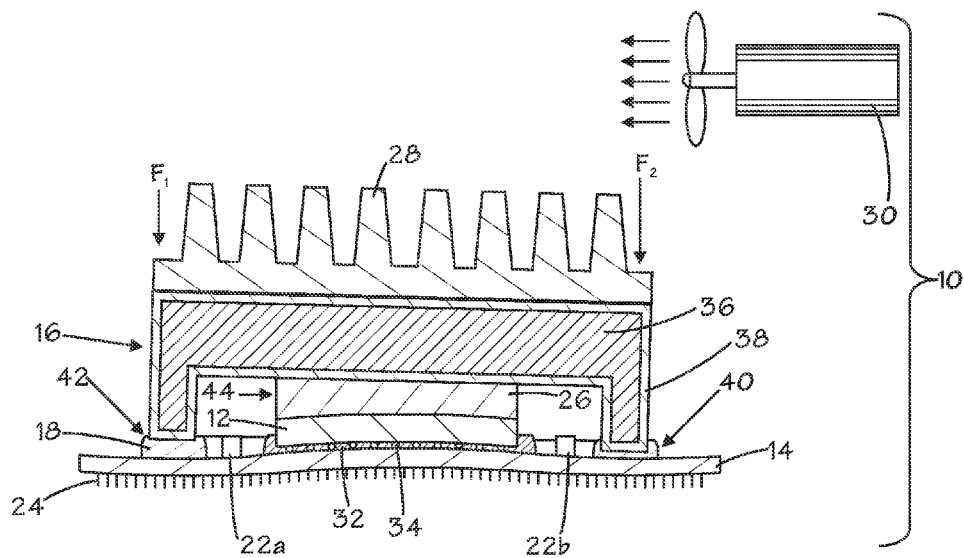
FIG. 2 is a sectional view of FIG. 1 taken at section 2-2.

Additional detail regarding the conventional package system 10 may be understood by referring now to FIG. 2, which is a sectional view of FIG. 1 taken at section 2-2. Note that in FIG. 2, the package system 10 is not shown exploded. Note also that because of the location of section 2-2, the filter capacitors 22a and 22b are visible but the filter capacitors 22c and 22d depicted in FIG. 1 are not. An underfill material 32 is disposed between the semiconductor die 12 and the upper surface of the substrate 14. A plurality of solder bumps 34 are disposed on the lower surface of the semiconductor die 12 and establish electrical contact with electrical interconnects (not shown) on the upper surface of the substrate 14. The electrical interconnects (not shown) are, in-turn, connected to the conductor pins 20. The substrate 14, and the combination of the integrated circuit 12 and the thermal interface material 26 are depicted with a warping that is commonly encountered when the lid 16 is secured to the substrate 14 and the adhesive bead 18 is thermally cured. The lid 16 is a jacketed design as shown in which a metallic core 36 is surrounded by a metallic jacket 38. The cooling fan 30 is depicted for continuity.

As noted in the Background Section hereof, asymmetrical mechanical loading on the heat sink 28 and the underlying lid 16 can produce unwanted effects, particularly on the thermal interface material 26. The situation is illustrated in FIG. 2. Here, the heat sink 28 is subjected to a force $F_1$ on one side and a larger magnitude force $F_2$ on the opposite side. The imbalance between the forces $F_1$ and $F_2$ is frequently caused by improper installation of the heat sink 28. Because the adhesive is designed to be somewhat compliant, the force-couple system of $F_1$ and $F_2$ causes the lid 16 to rotate. The rotation of the lid 16 compresses the adhesive 18 in the region 40 and stretches the adhesive 18 in the region 42. More importantly, the rotation produces a stretching of the thermal interface material 26 in the region 44. The stretched region 44 may fracture, debond from either the die 12 or the lid 16 or both. Even if no mechanical damage is produced, the stretched region 44 may still produce a local hot spot since the stretching in the region 44 creates greater spacing between the metallic particles in the thermal interface material. The greater particle spacing increases the thermal resistance of the stretched region 44. None of these outcomes is favored.

Figure 3:
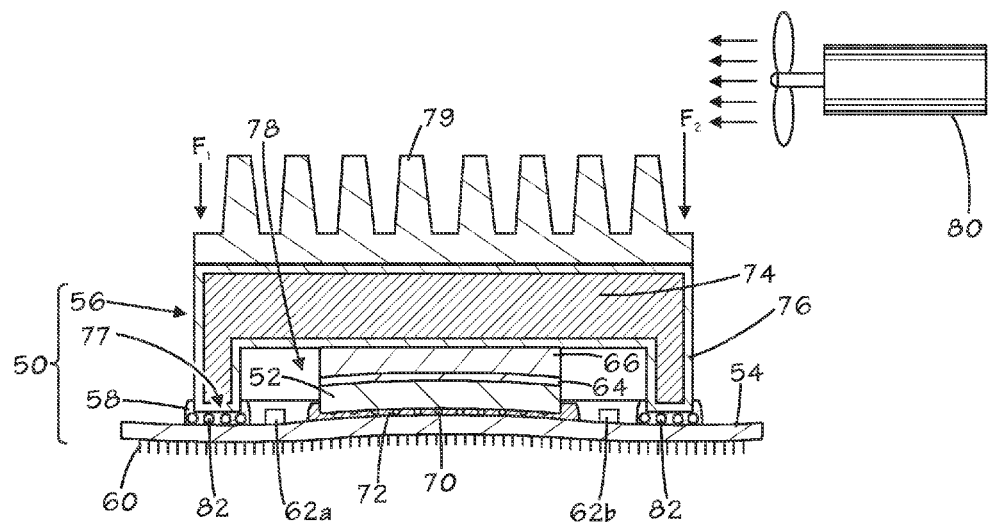
FIG. 3 is a sectional view of an exemplary embodiment of a semiconductor chip package in accordance with one aspect of the present invention.

FIG. 3 is a sectional view like FIG. 2, but of an exemplary embodiment of an integrated circuit package 50 in accordance with one aspect of the present invention. The package 50 is designed to alleviate the problem of thermal interface material stretching due to asymmetric lid loading. An integrated circuit 52 is mounted on a substrate 54, preferably though not necessarily in a flip chip orientation. A lid 56 is secured to the substrate 54 by way of an adhesive bead 58. The substrate 54 is depicted as a pin grid array. Accordingly, a plurality of conductor pins 60 project downwardly from the substrate 54 and are electrically connected to the integrated circuit 52 by way of conductors (not shown). However, it should be understood that the substrate may be a land grid array, a ball grid array, a printed circuit board or the like.

A plurality of filter capacitors 62a and 62b are provided to electrically isolate the integrated circuit 52 from certain types of signals coming up through the conductor pins 60. The number of capacitors is subject to design discretion.

The integrated circuit 52 is provided with an optional backside metallization stack 64. A polymeric thermal interface material 66 is also provided. The thermal interface material 66 is advantageously composed of polymeric materials such as, for example, silicone rubber mixed with aluminum particles and zinc oxide. Optionally, compliant base materials other than silicone rubber and thermally conductive particles other than aluminum may be used. Thermal greases and gold, platinum and silver represent a few examples. In an exemplary embodiment, silicone rubber is mixed with about 60-70% by volume aluminum and about 1-2% by volume zinc oxide. A commercially available product from Shinetsu may be used.

The substrate 54, and the combination of the integrated circuit 52, the backside metallization 64 and the thermal interface material 66 are depicted with a warping that is commonly encountered when the lid 56 is secured to the substrate 54 and the adhesive bead 58 is thermally cured. As noted above, the integrated circuit 52 is advantageously, though not necessarily, mounted to the substrate 54 in a flip chip fashion. In this regard, the integrated circuit 52 may be provided with a plurality of solder bumps 70 that are electrically connected to the conductor pins 60 by way of electrical interconnects (not shown). An underfill material 72 may be provided to serve as a stress cushion between the integrated circuit 52 and the substrate 54.

The selection of appropriate materials for the optional backside metallization 64 will depend on the composition of the integrated circuit 52 and the thermal interface material 66. In this exemplary embodiment, the backside metallization 64 consists of an aluminum film formed on the integrated circuit 52, a titanium film formed on the aluminum film, a nickel-vanadium film formed on the titanium film and a gold film formed on the nickel-vanadium film. The aluminum film provides advantageous adhesion with silicon. The titanium film provides a barrier layer to prevent gold from migrating into the integrated circuit 52, the nickel-vanadium film provides desirable adhesion between with gold and the gold film provides a desirable wetting surface for the thermal interface material 66. The stack 64 is formed on the integrated circuit 52 prior to application of the thermal interface material 66.

The lid 56 may be composed of a unitary piece of material or be outfitted as a jacketed design as shown in which a metallic core 74 is surrounded by a metallic jacket 76. In an exemplary embodiment, the core 74 consists of copper and the jacket 76 consists of nickel. The lower surface of the lid 56 consists of a rectangular lip 77 that is designed to seat on the adhesive bead 58 during assembly. The lip 77 has a width such that an interior space 78 is provided which encloses the integrated circuit 52 after the lid 56 is attached to the substrate 54.

A heat sink 79 is mounted on the lid 56. The heat sink 79 may be of virtually any configuration and composed of metallic or non-metallic materials. Copper may be used in an exemplary embodiment. A cooling fan 80 may be used in conjunction with the heat sink 79.

Assume for the purposes of this illustration that the heat sink 79, and thus the underlying lid 56, are subjected to asymmetric loading in the form of the force-couple $F_1$ and $F_2$. In order to compensate for asymmetric loading, the adhesive bead 58 is interspersed with a plurality of particles 82. The particles 82 form a bed that resists downward movement of the lip 77 and thus rotation of the lid 56 that might otherwise result in a stretching of the thermal interface material 66. Accordingly, the particles 82 are advantageously composed of a material capable of withstanding compressive loads. Exemplary materials include, for example, glass, gold, platinum, tungsten, tantalum or the like. If electrically conductive particles are used, then care must be taken to ensure that the adhesive 58 bead does not short to any conductive structures on the substrate 54. The particles 82 are sized to provide a compression-resistant cushion while enabling the adhesive bead 58 to continue to act as a compliant structure. In an exemplary embodiment, the particles 82 may have an approximate diameter of about 150-210 microns. However, the appropriate size will depend on the desired ultimate thickness of the thermal interface material 66. The particles 82 may be virtually any shape, such as spherical, rectangular or irregular. The concentration of the particles 82 in the adhesive 58 may be about 1-10% by volume. The particles 82 may be added to the adhesive 58 either before or after deposition on the substrate 54.

Figure 4:
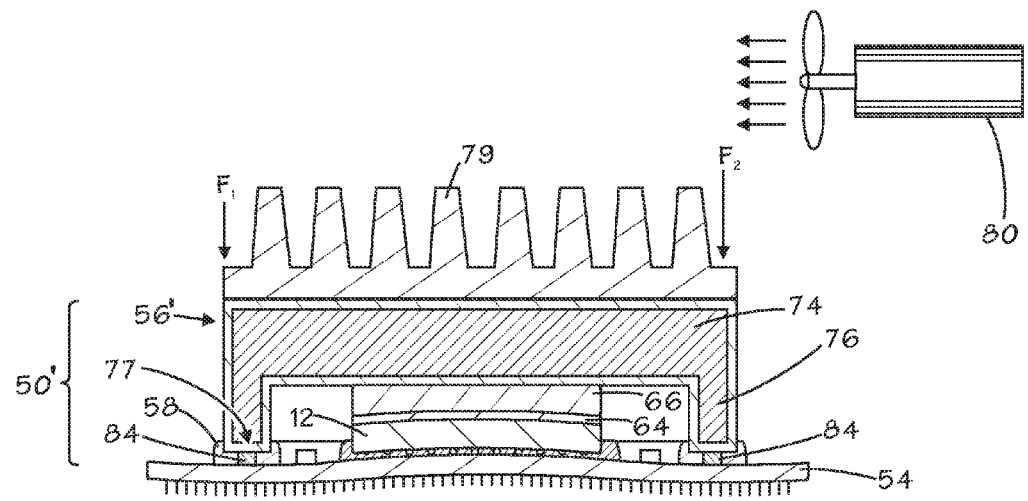
FIG. 4 is a sectional view of an alternate exemplary embodiment of a semiconductor chip package in accordance with one aspect of the present invention.

An alternate exemplary embodiment of a package 50' is illustrated in FIG. 4, which is a sectional view like FIG. 3. The package 50' shares many characteristics of the package 50 depicted in FIG. 3, such as an integrated circuit 52 mounted on a substrate 54 and a lid, designated 56', mounted on the substrate 54 by an adhesive 58. The integrated circuit 52 has a backside metallization layer 64 and a polymeric thermal interface material 66. Assume again for purposes of illustration that the heat sink 79 is positioned on the lid 56' and subjected to an asymmetric load in the form of the force-couple $F_1$ and $F_2$. In order to resist the unwanted rotation of the lid 56' that might otherwise lead to the stretching of the thermal interface material 66 described elsewhere herein, the lip 77 of the lid 56' is provided with a member or projection 84 that elevates the lip 77 of the lid 56' slightly above the substrate 54 and thus prevents the lid 56' from compressing the adhesive bead 58 asymmetrically due to the force-couple $F_1$ and $F_2$. One exemplary variant of the member 84 is depicted in pictorial form in FIG. 5. The member 84 may be a unitary structure that tracks the general perimeter of the lip 77 of the lid 56' as shown. In other words, the member 84 has a footprint that corresponds to the footprint of the lip 77. The member 84 may have a rectangular or other type of cross-section.

Figure 6:
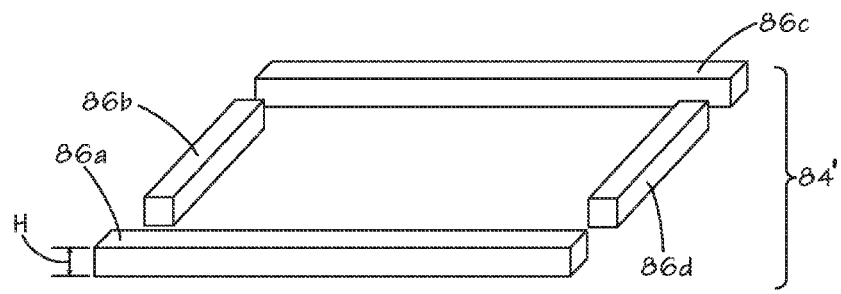
FIG. 6 is a pictorial view of an alternate embodiment of a member that may be used with the embodiment depicted in FIG. 4.

In another variant depicted in FIG. 6, a member 84' may be composed of multiple pieces or segments 86a, 86b, 86c and 86d. The number and size of the segments 86a, 86b, 86c and 86d is variable. Again, the segments 86a, 86b, 86c and 86d may be rectangular or other shape. Regardless of the specific shape, the segments or the member 84 are designed to preventing the type of lid rotation depicted in FIG. 2 while still enabling the adhesive bead 58 to provide a compliant cushion. Furthermore, it should be understood that the members 84 or 84' could be formed integrally with the lid 56' or as separate components as desired. If separate components, the members 84 or 84' may be composed of metallic or non-metallic materials.

The height H of either of the members 84 and 84' may be tied to the desired thickness of the adhesive 58. In an exemplary embodiment, the height H is selected to be slightly smaller than the desired thickness of the adhesive 58.

An exemplary process flow for assembling the package 50 depicted in FIG. 3 may be understood by referring again to FIG. 3. The process will be described in the context of a polymeric thermal interface material 66. Following the mounting of the integrated circuit 52, the adhesive film 58 is applied to the substrate 54 using well-known application techniques. The particles 82 shown in FIG. 3 may be present in the adhesive 58 prior to application or added after application. One example of a suitable adhesive 58 is silicone-based thixotropic adhesive, which provides a compliant bond.

Next, the polymeric thermal interface material 66 is applied to the integrated circuit 52. Well-known techniques may be used for the application.

The lid 56 is next seated on the adhesive film 58. The seating process may be accomplished by hand with the aid of a guide rack to be described in more detail below or by way of an automated machine. The lid 56 may be preheated prior to seating on the adhesive 58. For example, the lid 56 may be heated to about 100 to 135° C. for 5.0 to 10.0 minutes. The preheated lid 56 is next seated on the adhesive 58. It is anticipated that the temperature of the lid 56 will drop by perhaps 10.0 to 15.0° C. before being seated on the adhesive 58. At the time when the lid 56 is seated on the adhesive 58, the substrate 54 may be positioned in a fixture also to be described in more detail below and a compressive force applied to the lid 52 by way of the fixture. It should be noted that the adhesive 58 may be applied at any point prior to the seating of the lid 56.

With compressive force applied, the substrate 54 and lid 56 combination are subjected to a curing process. The curing process may be performed at about 100 to 150 °C. for about 30 to 120 minutes. The temperature and time will depend on the adhesive used.

Figure 7:
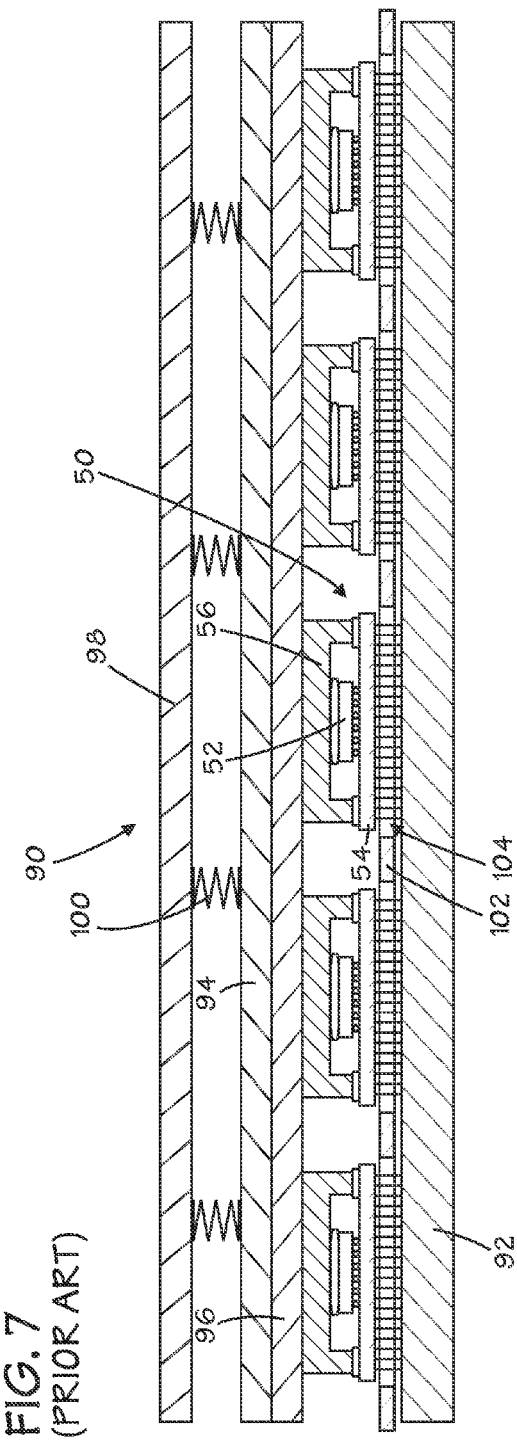
FIG. 7 is a cross-sectional view of a conventional fixture that may be used to assemble the package depicted in FIGS. 3 and 4.

In the process flow described elsewhere herein in conjunction with FIG. 3, it was noted that a fixture may be used to hold an integrated circuit package, such as the package 50, during various process steps. An exemplary embodiment of such a fixture 90 is depicted in FIG. 7, which is a cross-sectional view. A number of integrated circuit packages are depicted, however only one of the packages 50 is provided with element numbering. The description that follows focuses on the package 50, but is illustrative of any packages held by the fixture 90. The fixture 90 includes a base plate 92 upon which the circuit package 50 is seated. A middle plate 94 is designed to seat on top of the circuit package 50. The middle plate 94 is provided with a compliant sheet 96 composed of rubber or other compliant material. The middle plate 94 is brought into secure engagement with the upper surfaces of the circuit package 50 by way of a top plate 98 that includes a plurality of springs 100. Pressure is applied downward on the top plate 98 by an automated machine or manual clamps and results in a downward force transmitted through the middle plate 94 to the circuit package 50.

Figure 8:
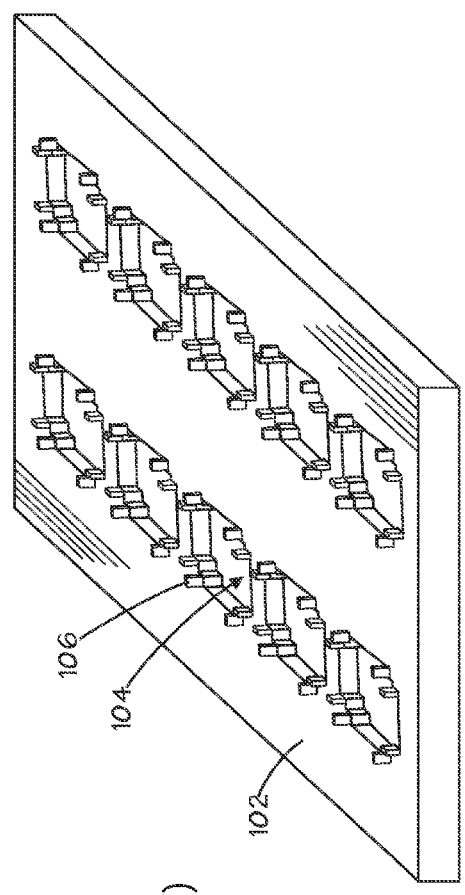
FIG. 8 is a pictorial view of a conventional boat that may be used with the fixture depicted in FIG. 7.

The assembly of the circuit package 50 involves a number of process steps that are routinely carried out in different locations. Accordingly, a rack or boat 102 is utilized to hold the circuit package 50 during movement between various processing areas. As better seen in FIG. 8, which is a pictorial view, the boat 102 includes a plurality of openings 104 and two upwardly-projecting posts 106 at each of the corners of the openings 104. The function of the posts 106 is to engage corners of the substrate 54 of the package 50 and thereby restrain yawing movements of the package 50.

Figure 9:
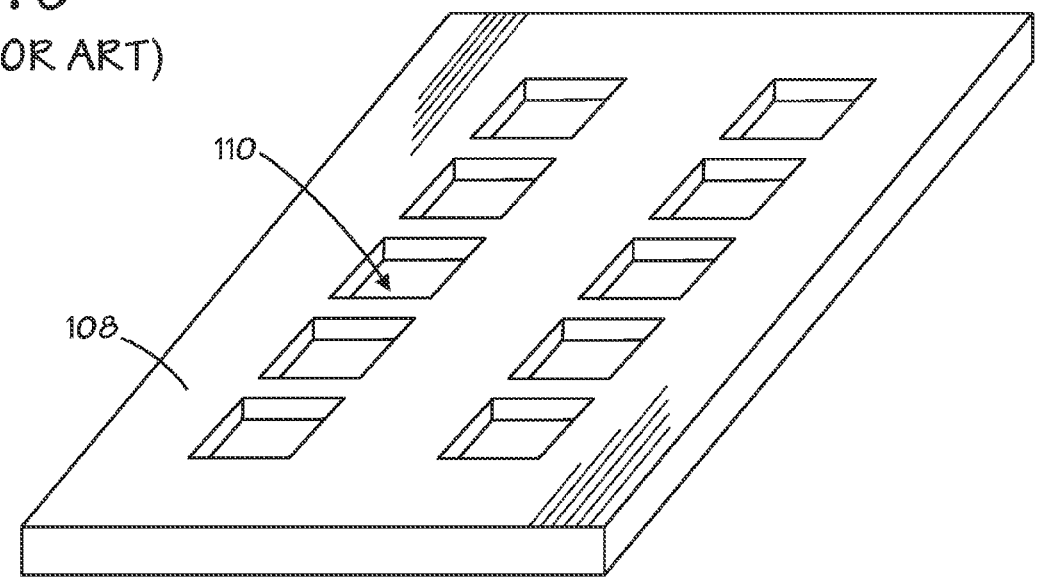
FIG. 9 is a pictorial view of an alignment rack that may be used with the fixture depicted in FIG. 7.

An optional lid alignment plate 108 is depicted in FIG. 9. The alignment plate 108 may be used to facilitate placement of the lid 52 56 on the substrate 54 of the package 50. With the alignment plate 108 temporarily placed over the package 50 and the base plate 92 (See FIG. 7), the lid 56 is dropped in one of the openings 110 of the alignment plate 108 and seated on the substrate 54. The alignment plate 108 may be removed prior to positioning of the middle and top plates 94 and 98 depicted in FIG. 7.

Figure 5:
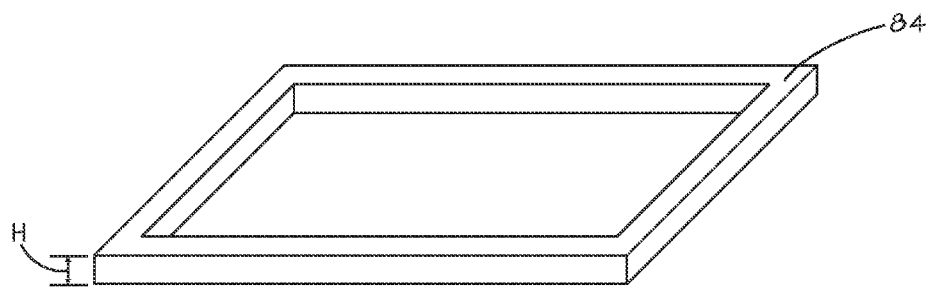
FIG. 5 is a pictorial view of an exemplary embodiment of a member that may be used with the embodiment depicted in FIG. 4.

The same general process flow described in conjunction with the embodiment of FIG. 3 may be used for the embodiment of FIGS. 4, 5 and 6 with some modifications. If the embodiments of FIGS. 4, 5 and 6 and separate members 84 or 84' are used, then the member 84 or 84' may be seated in the adhesive 58 prior to the seating of the lid 56'. If the members 84 or 84' are formed integral with the lid 56', then no separate seating step is required for the members 84 or 84'.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of packaging an integrated circuit, comprising:
    coupling an integrated circuit to a substrate, the substrate including a plurality of conductor structures therein;
    placing a thermal interface film on the integrated circuit, the thermal interface film having a polymer matrix and a plurality of metallic particles dispersed therein;
    mixing an adhesive with a plurality of particles so as to form a bed of particles being retained by the adhesive wherein the particles are not adapted to be physically bonded to one another after being mixed with the adhesive; and
    coupling a lid to the substrate with the adhesive, at least a portion of the plurality of particles in the adhesive opposing compressive force from the lid to restrict rotation of the lid relative to the substrate and constrain spatial separation of the metallic particles.

2. The method of claim 1, wherein the particles comprise glass particles.

3. The method of claim 1, wherein the particles comprise spherical particles.

4. The method of claim 1, wherein the particles comprise a metallic material.

5. The method of claim 1, comprising coupling a thermal interface material to a surface of the integrated circuit and a surface of the lid.

6. The method of claim 5, wherein the thermal interface material comprises a polymeric material.

7. The method of claim 1, comprising coupling a heat sink to the lid.

8. A method of packaging an integrated circuit, comprising:
    coupling an integrated circuit to a substrate, the substrate including a plurality of conductor structures therein;
    placing a thermal interface film on the integrated circuit, the thermal interface film having a polymer matrix and a plurality of metallic particles dispersed therein;
    mixing an adhesive with a plurality of particles so as to form a bed of particles being retained by the adhesive wherein the particles are not adapted to be physically bonded to one another after being mixed with the adhesive; and
    coupling a lid having a lip defining an interior space to the substrate with the adhesive, the integrated circuit being positioned in the interior space, the thermal interface film being contact with a surface of the lid, at least a portion of the plurality of particles in the adhesive opposing compressive force from the lip of the lid to restrict rotation of the lid relative to the substrate and constrain spatial separation of the metallic particles.

9. The method of claim 8, wherein the particles comprise glass particles.

10. The method of claim 8, wherein the particles comprise spherical particles.

11. The method of claim 8, wherein the particles are irregularly shaped.

12. The method of claim 8, wherein the particles comprise a metallic material.

13. The method of claim 12, wherein the metallic material comprises gold, platinum, tungsten or tantalum.

14. The method of claim 8, wherein the metallic particles comprise aluminum, gold, platinum or silver.

15. The method of claim 14, wherein the concentration of the particles in the adhesive comprises about 1-10% by volume.

16. The method of claim 8, comprising coupling a heat sink to the lid.

17. The method of claim 1, wherein the particles are irregularly shaped.

18. The method of claim 4, wherein the metallic material comprises gold, platinum, tungsten or tantalum.

* * * * *